(12) United States Patent
Daud et al.

(10) Patent No.: US 7,454,301 B1
(45) Date of Patent: Nov. 18, 2008

(54) METHOD AND APPARATUS FOR PREDICTING SYSTEM NOISE

(75) Inventors: Nafira Daud, Pleasanton, CA (US);
Iliya G. Zamek, San Jose, CA (US);
Peter Boyle, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 49 days.

(21) Appl. No.: 11/465,725

(22) Filed: Aug. 18, 2006

(51) Int. Cl.
*H03K 1/04* (2006.01)

(52) U.S. Cl. .............................. 702/69; 702/66; 702/72; 702/74; 702/75; 702/76; 327/115; 327/116; 327/144; 327/145; 327/296; 324/765

(58) Field of Classification Search .................... 702/66, 702/69, 72, 74–76; 324/765; 327/115–116, 327/144–145, 296; 340/172.5; 364/200
See application file for complete search history.

(56) References Cited

U.S. PATENT DOCUMENTS 5,834,956 A * 11/1998 Pathikonda et al. ......... 327/116

2003/0132775 A1 * 7/2003 Yamanaka et al. .......... 324/765

* cited by examiner

*Primary Examiner*—John E. Barlow
*Assistant Examiner*—Sujoy K Kundu
(74) *Attorney, Agent, or Firm*—Martine Penilla & Gencarella, LLP

(57) ABSTRACT

A jitter calculator engine that includes a core effects module, an input/output (I/O) module, and a phase lock loop (PLL) module is provided. The core effects module estimates core jitter caused by noise effects impacting a core clock network. The I/O module estimates I/O input pin switching effects on a clock network input signal. In one embodiment, the I/O module identifies a relative frequency of switching by I/O pins in the circuit design. The PLL module estimates an effect of a PLL on a signal delivered to the PLL from an I/O pin. The PLL module accounts for I/O input pin switching effects and core jitter. The jitter calculator engine may be in communication with a database and the different designs evaluated may be stored in the database so that the database becomes a repository for the different designs and may provide useful information for future designs.

20 Claims, 10 Drawing Sheets

000
METHOD AND APPARATUS FOR PREDICTING SYSTEM NOISE

BACKGROUND

System noise is an increasing concern in the electronics industry. As system operating frequencies increased, timing margins have decreased, making system noise more vulnerable to failure caused by noise that could previously be ignored. While the system noise problems associated with processors are constantly being looked at, programmable logic devices have a further level of complexity because of the varied environments in which the programmable logic device may be used. Therefore, in order to account for the wide variations in which a programmable logic device may be employed, a worst-case scenario is used to generate the specifications that a customer will see. However, a customer may be deterred from utilizing a programmable logic device based on the worst-case scenario even though the customer's application will not encounter these worst-case environmental concerns.

Thus, an improved technique for predicting system noise within a customer's applications is needed for the multiple environments in which the programmable logic device may be used.

SUMMARY

Embodiments of the present invention provide a method and a framework for calculating system jitter of an integrated circuit design. It should be appreciated that the present invention can be implemented in numerous ways, such as a process, an apparatus, a system, a device or a method on a computer readable medium. Several inventive embodiments of the present invention are described below.

In one aspect of the invention, a method for calculating system jitter in an integrated circuit design is provided. The operating parameters associated with the integrated circuit design are identified, e.g., the environmental conditions, as well as the incoming jitter and operating frequency. The Input/Output (I/O) pins and the interaction between the I/O pins are evaluated based on the location of the I/O pins in the integrated circuit design. In one embodiment, capacitive and inductive coupling caused by active I/O switches is identified by the jitter calculator, so that the effected pin or pins may be moved to avoid a re-spin of a printed circuit board. The effect of the interaction of the I/O pins is isolated for determination of the system jitter. The impact of a phase lock loop (PLL) on the jitter of an incoming signal to the PLL is also determined. The impact of the PLL to the jitter of the incoming signal and the effect of the interaction between Input/Output (I/O) pins are combined to derive the system jitter. In one embodiment, when evaluating the PLL, the clock distribution network within the core is evaluated to capture the effect of any noise in the core on the jitter.

In another aspect of the invention, a jitter calculator engine for estimating system jitter within a circuit design is provided. The jitter calculator engine includes a core effects module, an input/output (I/O) module, and a phase lock loop (PLL) module. The core effects module estimates core jitter caused by noise effects impacting a core clock network. The I/O module estimates I/O input pin switching effects on a clock network input signal. In one embodiment, the I/O module identifies a relative frequency of switching by I/O pins in the circuit design. The PLL module estimates an effect of a PLL on a signal delivered to the PLL from an I/O pin. The PLL module accounts for I/O input pin switching effects and core jitter. The jitter calculator engine may be in communication with a database and the different designs evaluated may be stored in the database so that the database becomes a repository for the different designs and may provide useful information for future designs.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

The embodiments described herein provide a tool for simplifying the design of integrated circuits. It will be obvious, however, to one skilled in the art, that the present invention may be practiced without some or all of these specific details. In other instances, well known process operations have not been described in detail in order not to unnecessarily obscure the present invention.

Programmable logic devices are incredibly complex devices. The systems that are designed to run the programmable logic devices are primarily synchronous systems, meaning they run from some sort of clock. Timing uncertainty in the system clock directly impacts the maximum frequency at which the system can operate. In order to predict the maximum frequency at which the system can run, the clock uncertainty must be estimated. The embodiments described herein enhance system speeds, case system design, and improve system stability by accurately predicting the uncertainty for the clock and advising system designers on techniques to reduce timing uncertainty. The embodiments described below estimate short term timing uncertainties considered in the time domain, typically referred to as jitter. The proposed system will calculate jitter in the clock networks, phase lock loops (PLL) and input/output clocks, thereby providing a designer more information to enhance the design process.

Figure 1:
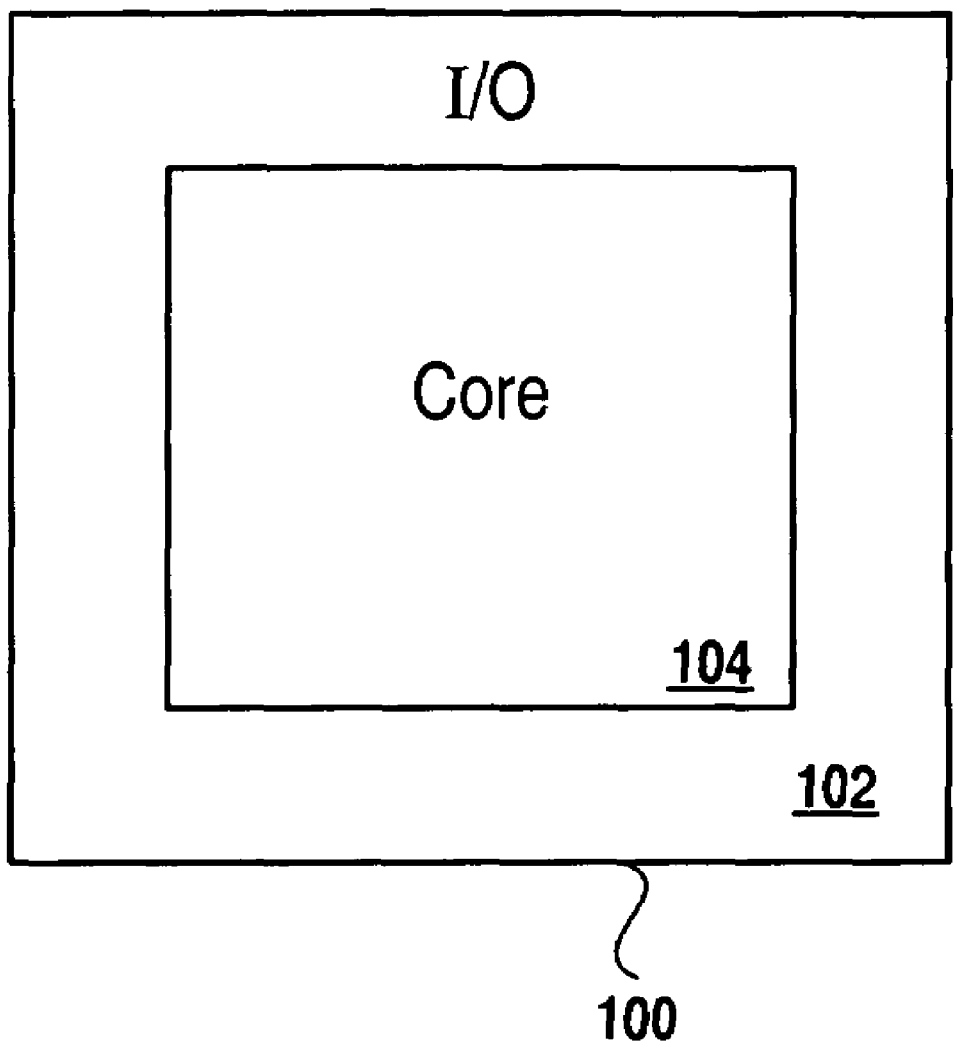
FIG. 1 is a high level simplified schematic diagram of an exemplary chip design.

FIG. 1 is a high level simplified schematic diagram of a typical chip design. Chip 100 includes Input/Output (IO) ring 102 surrounding core region 104. IO ring 102 will run at a higher voltage than core region 104. In one embodiment, IO ring 102 runs at approximately 3.3 volts while core region 104 operates at approximately 1.1 volts. It should be appreciated that chip 100 may be any integrated circuit, such as a processor, application specific integrated circuit (ASIC), or a programmable logic device (PLD). When designing an integrated circuit, designers must provide a layout that meets all of the timing requirements for all the signals being processed. The embodiments described below assist a designer by providing an estimate of the noise so that a more accurate timing margin may be derived, rather than planning for a worst case and applying the worst case to all designs. Thus, the embodiments described herein avoid the restrictive nature of the one size fits all approach.

Figure 2:
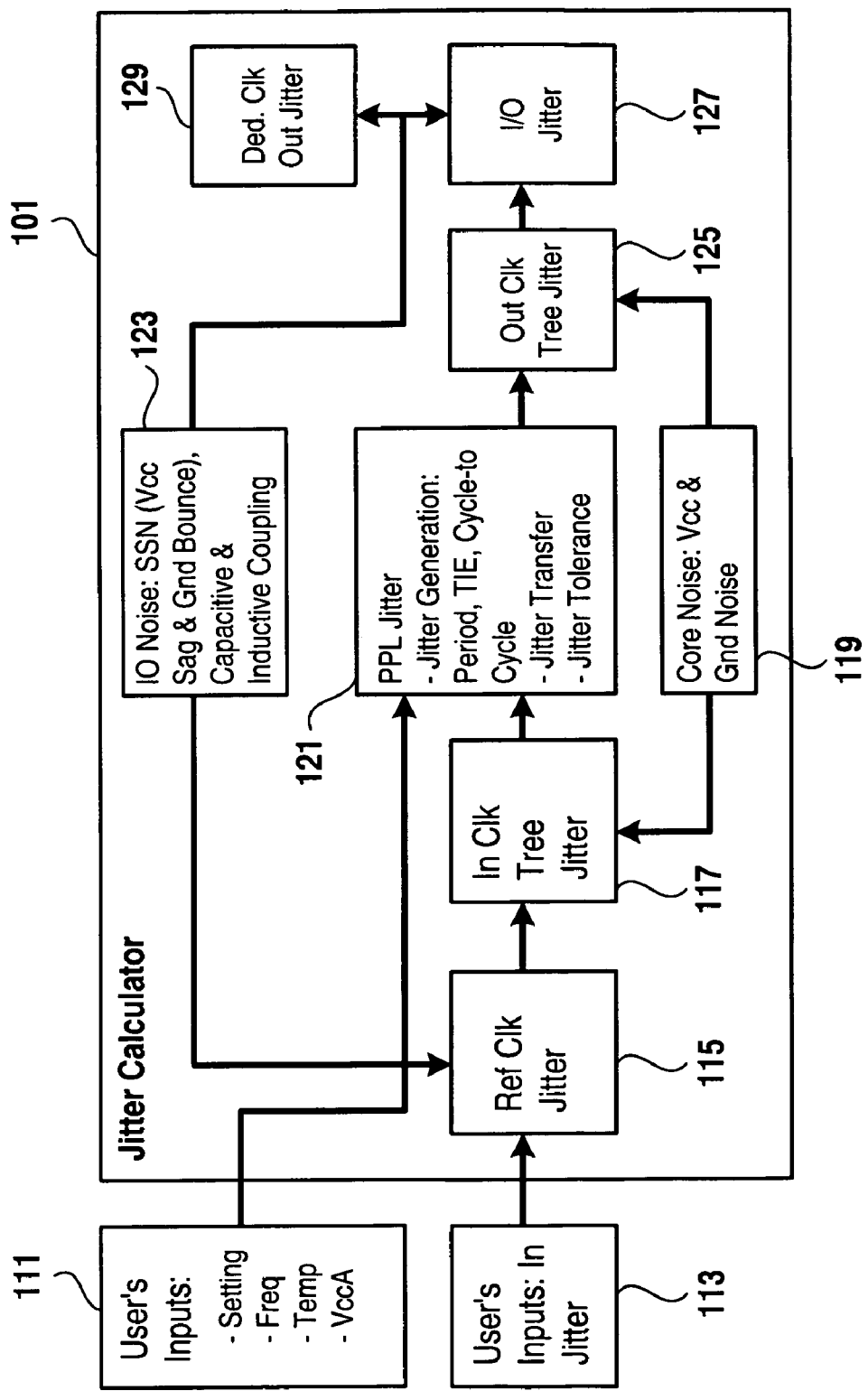
FIG. 2 is a simplified schematic diagram illustrating major blocks of a jitter calculator that estimates system noise in a chip design in accordance with one embodiment of the invention.

FIG. 2 is a simplified schematic diagram illustrating major blocks of a jitter calculator that estimates system noise in a chip design in accordance with one embodiment of the invention. Jitter calculator 101 described herein may be a modular logic block within a system for electronic design automation (EDA). Alternatively, Jitter calculator 101 may be a stand-alone system. The different modules of jitter calculator 101 will estimate certain aspects of the effect on the clock network as will be described in the figures below. In one embodiment, jitter calculator 101 functions by dividing effects on the clock network into four areas. The four areas include core effects, input/output (I/O) effects, phase locked loop (PLL) effects and user inputs. It should be appreciated that each of the areas is dominated by different variables, in addition to interacting with each other.

With regard to the core effects, Jitter calculator 101 of FIG. 2 examines what is occurring within the clock distribution network of the core of the integrated circuit through modules 117, 119, and 125. Module 117 evaluates the input path of the core clock distribution network. Module 119 evaluates the contribution of the power ($V_{cc}$) and the ground in the core to the core noise. Module 125 evaluates the output of the clock tree from the core and determines the effects from this output on the Jitter. It should be appreciated that the buffering of the clock network in the core can be adversely affected by noise effects (power noise, coupling to surrounding logic etc.) which, in turn can make parts of the circuit late or early relative to their peers. This degradation in clock quality can be addressed by improved placement of logic or, if no improvement in quality is possible, at least the degradation can be understood and accounted for. Furthermore, the clock in the core can be used to drive outputs that are used to communicate with other chips. Any noise effects in the core will be apparent on these outputs. Additionally, the individual pattern entered by the user will be analyzed and compared against the core power distribution and the clock tree utilized to study noise impacts and make recommendations for modifications to the chip design. Further details on the core effects are discussed with regard to FIG. 3.

I/O effects can have a significant impact on the jitter. Modules 115, 123, 127, and 129 of FIG. 2 evaluate the I/O effects. One skilled in the art will appreciate that the I/O voltage can vary significantly as opposed to the target voltage in the core, which tends to be relatively steady. This variability may cause unintended interference that Jitter calculator 101 will identify. Module 115 estimates the contribution of the reference clock signal to the jitter. Here the input clock signal may have a certain amount of jitter and jitter calculator 101 recognizes this jitter through module 115. Module 123 determines I/O noise due to simultaneous switching noise (SSN) and capacitive and inductive coupling. As illustrated below with regard to FIGS. 4-8, the effects of the SSN, which may result in $V_{cc}$ Sag and ground bounce, and the capacitive and inductive coupling are captured through module 123. Module 129 estimates the dedicated clock out jitter. Module 127 derives the I/O jitter. Switching I/O can affect the quality of the input to the clock network through capacitive coupling, inductive coupling, $V_{cc}$ sag or ground bounce, as represented by modules 115 and 123. This can negatively affect internal timing in the device. Switching I/O can also degrade the output clock of the FPGA to other devices, e.g., a double data rate (DDR) memory, as captured by modules 123 and 129. Predicting these degradations accurately allow for better system stability. Through jitter calculator 101 recommendations for I/O placement can be made to the user before problems arise, which may force an expensive re-spin of a printed circuit board.

Still referring to FIG. 2, PLL effects are calculated through module 121. One skilled in the art will appreciate that the PLL is a complex analog circuit used to control clock phase relationships and frequencies of clocks. The PLL can be mathematically modeled using standard formulas. Jitter calculator 101 employs these mathematical formulas to accurately describe the performance of the PLL by accounting for noise interactions with the PLL, such as input reference clock and power noise effects (caused by core noise, IO noise, etc.). As illustrated, module 121 utilizes information from modules 115, 117, 119 and 123 to define the effects of this jitter on the PLL and the contribution of the PLL to the overall jitter.

Jitter calculator 101 of FIG. 2 will use the inputs from the user, e.g., I/O placements, frequencies used, logic placement, temperature, supply voltages, etc., to individually analyze the users design and predict the real noise that will be experienced. Modules 111 and 113, which capture the user's data, are accessed by jitter calculator 101. Jitter calculator 101 will also report what items in the design are the biggest contributors and how they may be altered to improve results. It should be appreciated that in one embodiment, Jitter calculator 101 may exist as an application within a design software package as illustrated with reference to FIG. 10, or a stand-alone package. Furthermore, each of the modules of FIG. 2 contains code to execute the functionality described above to determine the jitter contribution for the core, I/O, PLL and user settings.

The following descriptions for each of the above modules are presented to further define the functionality performed by each of the corresponding modules of FIG. 2. Module 111 takes in information about an individual user's design. Exemplary information may include actual expected temperature and voltage conditions, logic design information, such as operating frequencies and synchronicity of clock domains, and physical design information, such as I/O pin placement and logic placement inside the core. Module 113 takes in information about an individual user's design, which may include information describing the jitter that the user is applying to the clock input. This information may come in several forms including, but not limited to, total jitter (period, time interval Error, cycle to cycle), decomposed jitter (random and deterministic components), or frequency spectrum. Module 115 analyzes the effect of the input buffers on the jitter. The input buffers may add noise due to effects of other switching I/Os or attenuate noise due to filtering properties inherent in the buffer's design. Module 117 analyzes any core effects on the input path to the PLL or prior to reaching the distribution network. Module 119 analyzes switching logic from the individual user design and estimates fluctuation in the core power distribution network. This data is then fed to other blocks to estimate the alteration in timing (jitter). Module 123 analyzes fluctuation in $V_{cc}$ or GND for I/O due to switching effects, e.g., SSN, and any other effects due to coupling. Module 121 analyzes the selected settings for the PLL from module 111, the input jitter, which is the output of module 117, and the output from modules 123 and 119 to determine the output jitter of the PLL. Module 125 analyzes the estimated Vcc and GND noise from module 119 and estimates jitter added by the clock tree. Regional effects due to the intensity of aggressor noise can be analyzed to determine the differences in jitter between various branches of the clock network here. It should be appreciated that many ICs have special pins dedicated to be clock outputs which are isolated from noise effects in the core and I/O. Module 129 accounts for and analyzes clocks driven off the chip from these specialized I/O pins. Module 127 analyzes non-dedicated output pins, similar to module 129 analyzing the dedicated output pins. In one embodiment, the output from module 127 is used to imply clock jitter effects on data output pins.

Figure 3:
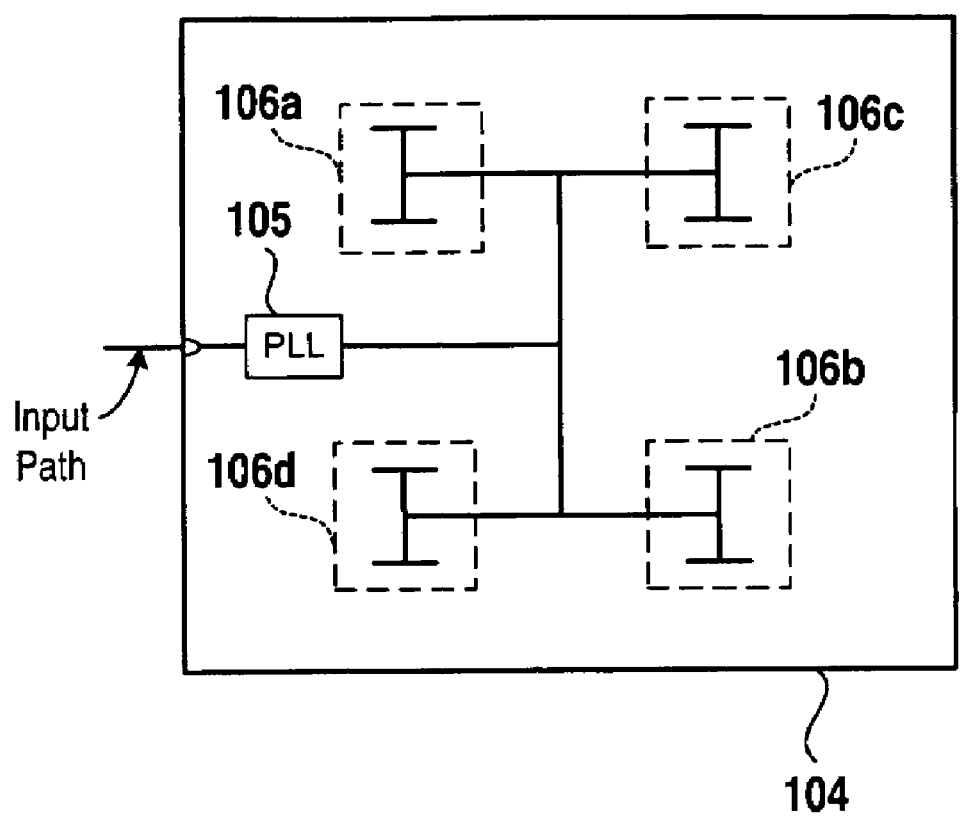
FIG. 3 illustrates a simplified exemplary clock distribution network for a chip design.

FIG. 3 illustrates a simplified exemplary clock distribution network for a chip design. The architecture of most digital systems includes a clock distribution network. This clock network is buffered to arrive at most points in the chip simultaneously to maintain predictable timing. Core 104 includes an input path for a clock and typically the clock signal will be delivered to a center of core 104 and distributed therefrom. That is, the clock signal will come into core 104 and proceed into PLL 105 and then distributed to regions 106a through 106d from a center region of the core. By having the clock distributed from a center region of the core certain guarantees such as synchronous timing will be achieved. Thus, a clock signal to region 106a will be synchronous to a clock signal received at regions 106b-d because of the symmetry in design. However, the buffering requirement used to guarantee arrival at most points in a chip simultaneously, can be adversely effected by noise effects (power noise, coupling to surrounding logic, etc.). This can make parts of the circuit late or early relative to other parts of the circuit. In one embodiment, the degradation in the clock quality can be improved by accounting for this timing impact and changing some of the impacts. Additionally, the clock signal in the core can be used to drive outputs that are used to communicate with other chips. Any noise effects in the core will be apparent to these outputs. In one embodiment, region 106a may be a highly active region while region 106b is a more stable region. The jitter calculator described herein will account for this activity in order to analyze its effects on the clocking for the core 104. In one analogy, the high level of switching in region 106a may be akin to removing water very quickly from one side of the bathtub. Once the water is quickly removed, the level on one end of the bathtub is different than the level of the water on an opposite end of the bathtub because of the quick removal of the water. Referring back to chip design, consuming a lot of power in one area will impact the logic in that area. This power consumption is associated with an inductive property that will cause the voltage to rise and drop in response to the power consumption changes. As the voltage rises, the region will perform activities more quickly and when the voltage drops, the region will perform activity slower, thereby impacting the clocking. In one embodiment, the jitter calculator described herein analyzes this feature and may suggest to distribute some of the logic from the high switching area from region 106a over different areas of core 104 that are more stable, i.e., do not switch as frequently.

Figure 4:
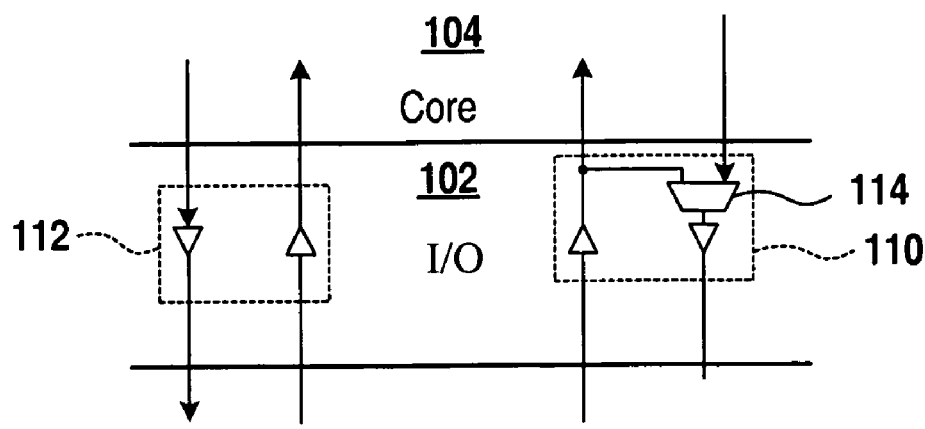
FIG. 4 is a simplified schematic diagram of input output drivers to illustrate the impact on the timing of a circuit in accordance with one embodiment of the invention.

FIG. 4 is a simplified schematic diagram of input/output (I/O) drivers to illustrate the impact on the timing of a circuit in accordance with one embodiment of the invention. As mentioned above, switching I/O can effect the quality of the input to the clock network through capacitive coupling, inductive coupling, $V_{cc}$ sag or ground bounce. This can negatively effect internal timing in the device. Switching I/Os can also degrade the output clock of the circuit to other devices, e.g., a memory region. Predicting these degradations accurately allows for improved system stability. A high switching driver may cause sags and spikes in voltage, which may then translate to timing noise impacts. For example, if the IO drivers in region 112 are switching often, an impact will be caused on the IO drivers in region 110. In one embodiment, the high switching IO drivers in region 112 may be referred to as aggressor drivers, while the drivers in region 110, which feel the impact of this high switching, are referred to as victim drivers. It should be appreciated that in order to analyze this impact, the drivers within region 110 are evaluated without analyzing any effects from core region 104 in the physical design. Multiplexor 114 is incorporated into region 110 so that the input from IO region 110 can be routed and analyzed without passing through core region 104. That is, through multiplexor 114, the input through region 110 is routed back out thereby staying within IO region 102. Thus, the impacts of the switching in the I/O region without any effects from the core in the actual silicon can be physically tested. Of course, the jitter calculator can recommend moving the victim I/O or aggressor I/O region in the design phase, as described in the embodiments contained herein. It should be appreciated that the embodiments described herein may maintain a database so that different designs may be evaluated based on specific user applications. That is, the analysis of the chip design and/or actual performance of the chip may be stored within a database to facilitate future designs as illustrated with reference to FIG. 10.

Figure 5:
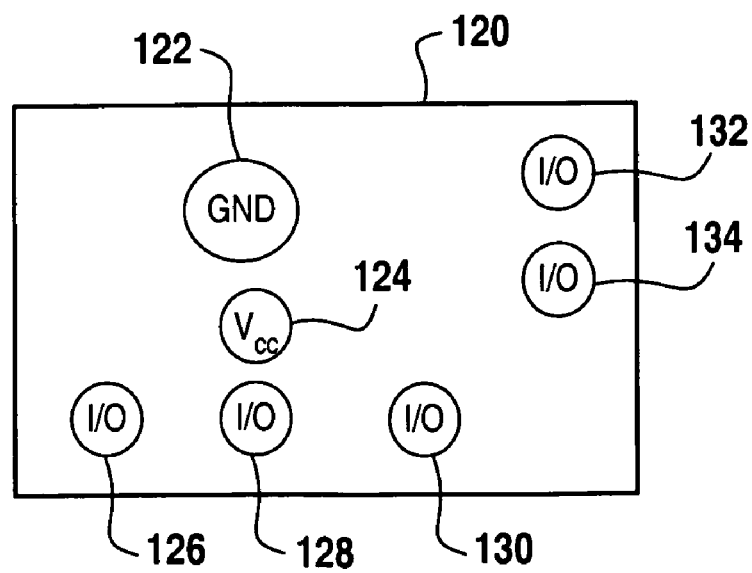
FIG. 5 is a simplified schematic diagram illustrating effects of packaging on the power supply for a PLL in accordance with one embodiment of the invention.

FIG. 5 is a simplified schematic diagram illustrating effects of packaging on the power supply for a PLL in accordance with one embodiment of the invention. FIG. 5 is an exemplary bottom view of pins from a package containing an integrated circuit die. Chip 120 includes pins for ground 122, $V_{cc}$ 124, and I/O pins 126, 128, 130, 132 and 134. As illustrated, the location of $V_{cc}$ pin 124 may be impacted by any of the I/O pins 126, 128, and 130. Especially if one of I/O pins 126 through 130 is a high-switching pin, i.e., highly active. A capacitive and inductive coupling effect can impact the timing by affecting the power supply of $V_{cc}$ pin 124. Therefore, the jitter calculator described herein will identify this issue and a possible solution to move a high switching I/O pin, e.g., pins 126 to 130, to a location that is not proximate to $V_{cc}$ pin 124. For example, the high switching I/O pin 126 through 130 may be moved to either of I/O pin 132 or 134, thereby alleviating this issue in the design phase.

Figure 6:
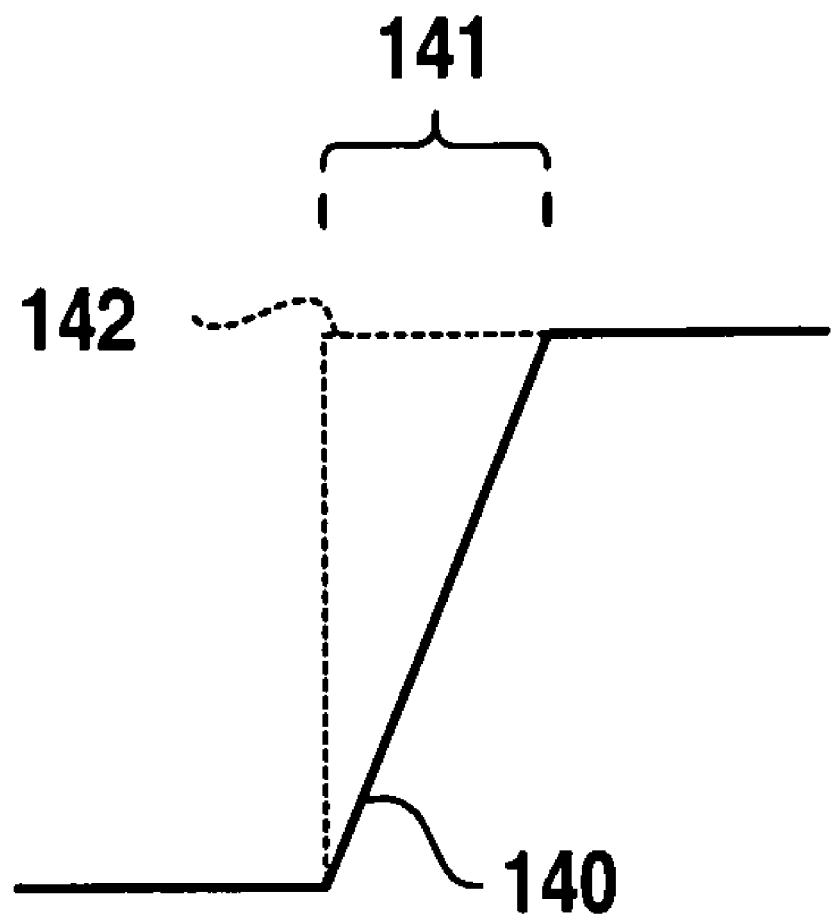
FIG. 6 is a simplified graph illustrating the impact of the I/O pins on the timing in accordance with one embodiment of the invention.

FIG. 6 is a simplified graph illustrating the impact of the I/O pins on the timing in accordance with one embodiment of the invention. Line 140 represents an edge for the time clock out under noisy conditions, as opposed to line 142, which represents the edge under quiet conditions. As illustrated, delay 141 is shown due to this I/O switching effect discussed above. Through the embodiments described herein, this noise may be alleviated to reduce the timing margin and operate at a higher frequency, rather than use a restrictive worst case in the design. As a result, the actual chip may be able to operate at a higher frequency than if the worst case was assumed for the design.

Figure 7:
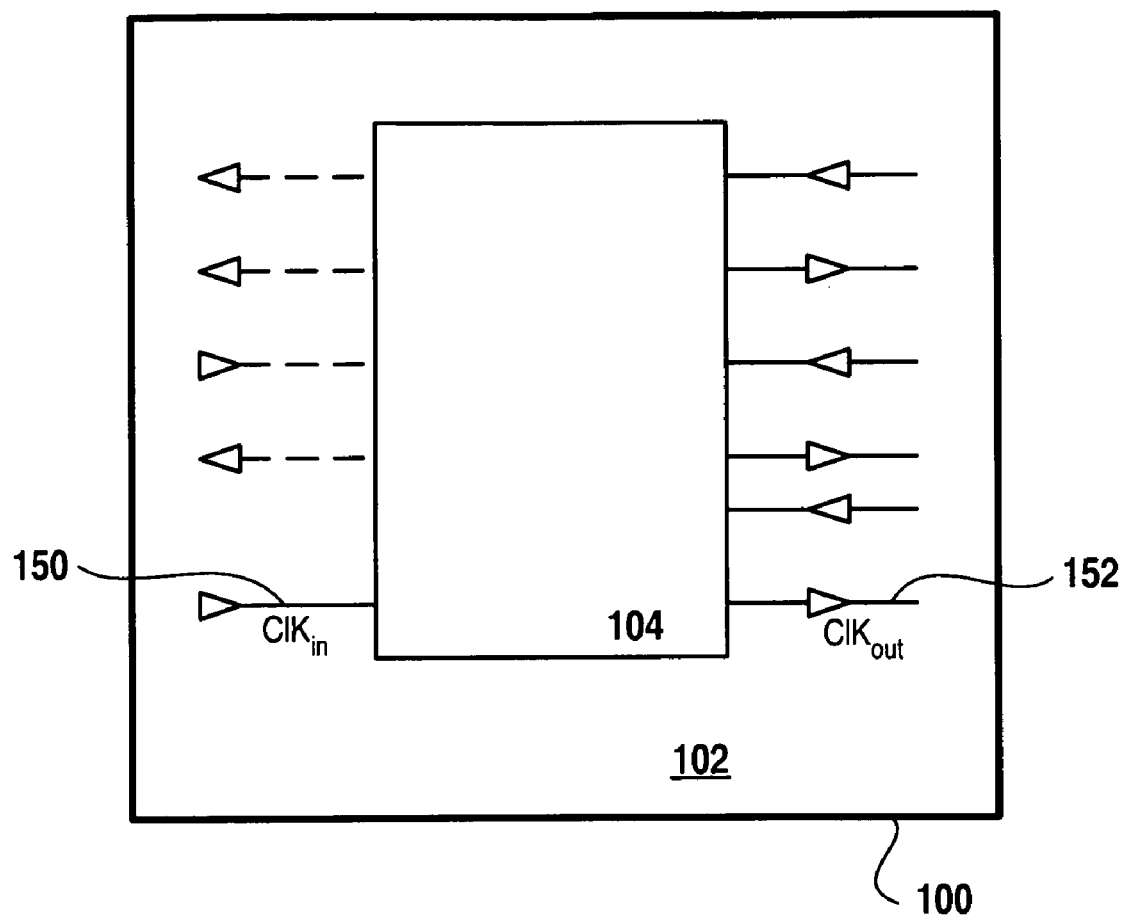
FIG. 7 is an alternative embodiment of FIG. 4 illustrating I/O impacts on a clock in and clock out signal in accordance with one embodiment of the invention.

FIG. 7 is an alternative embodiment of FIG. 4 illustrating I/O impacts on a clock in and clock out signal in accordance with one embodiment of the invention. As discussed above, clock in signal 150 may be impacted by I/O drivers in the vicinity of the line buffering the clock in signal. Similarly, the clock out signal 152 may be impacted by I/O drivers proximate to the clock out driver. Here again, the jitter calculator will identify these issues so that high switching I/O drivers may be distributed in a manner that limits the impact of the switching activity.

Figure 8:
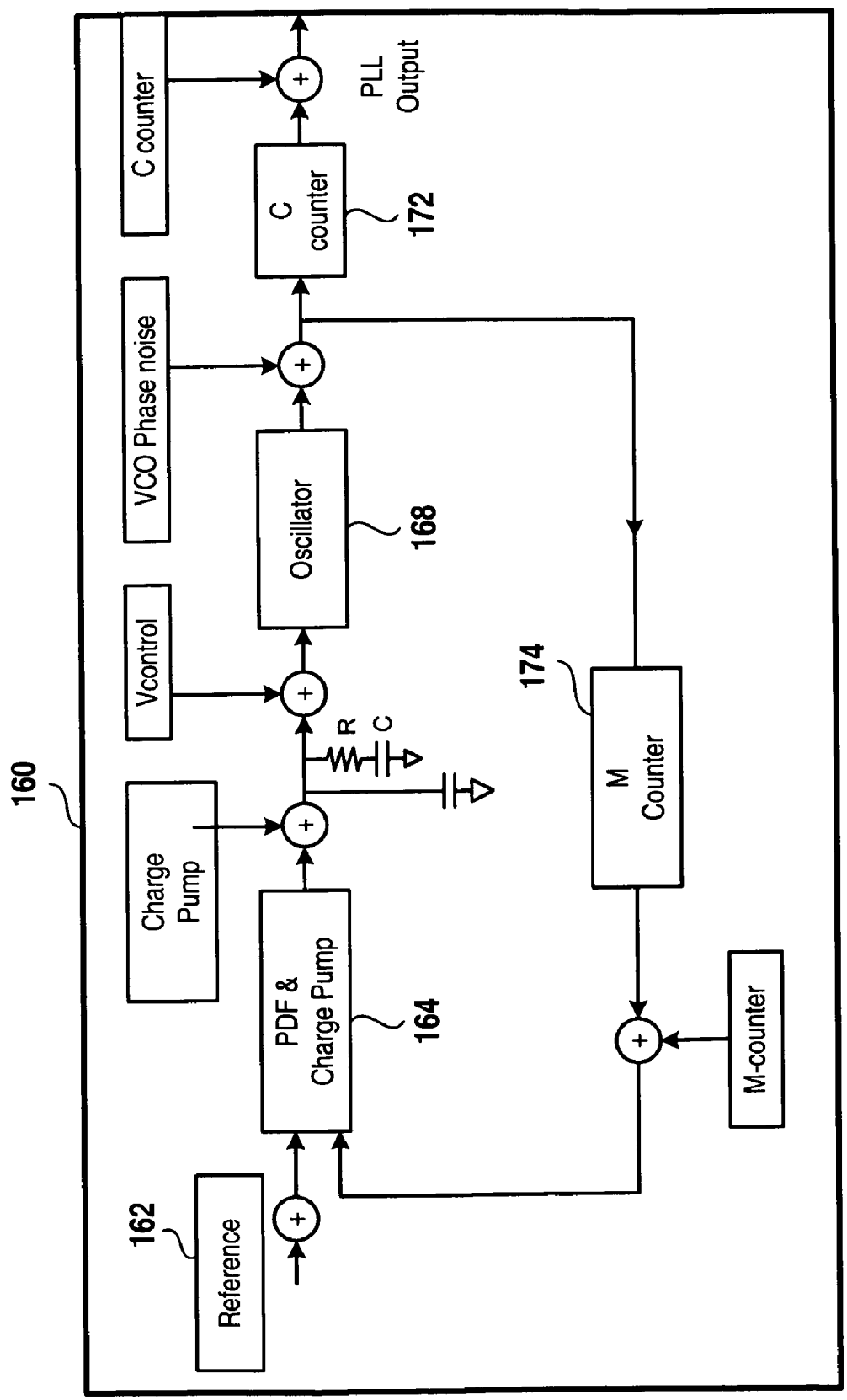
FIG. 8 is a simplified schematic diagram of a phase lock loop that may be evaluated in accordance with one embodiment of the invention.

FIG. 8 is a simplified schematic diagram of a phase lock loop that may be evaluated in accordance with one embodiment of the invention. Phase lock loop 160 includes phase frequency detector (PFD) charge pump 164, oscillator 168, such as a voltage control oscillator (VCO) or a resonator, e.g., an inductor capacitor circuit (LC) tank, C-counter 172 and M-counter 174. Reference clock signal 162 comes in to charge pump 164 and can be adjusted based on certain user settings in order to provide a frequency desired by the user. It should be appreciated that a programmable logic device (PLD), such as a field programmable gate array (FPGA), may have thousands of settings that can be changed by taking reference clock 162 and multiplying the reference clock to derive a desired frequency. Thus, if reference clock 162 includes a certain amount of noise, the PLL can add to this noise or can attenuate the noise depending on the settings. Jitter calculator 101 of FIG. 2 will determine the attenuation or enhancement of noise through PLL 160. One skilled in the art will appreciate that boxes connected to the circled + signs represent points where noise may be introduced into the loop.

Figure 9:
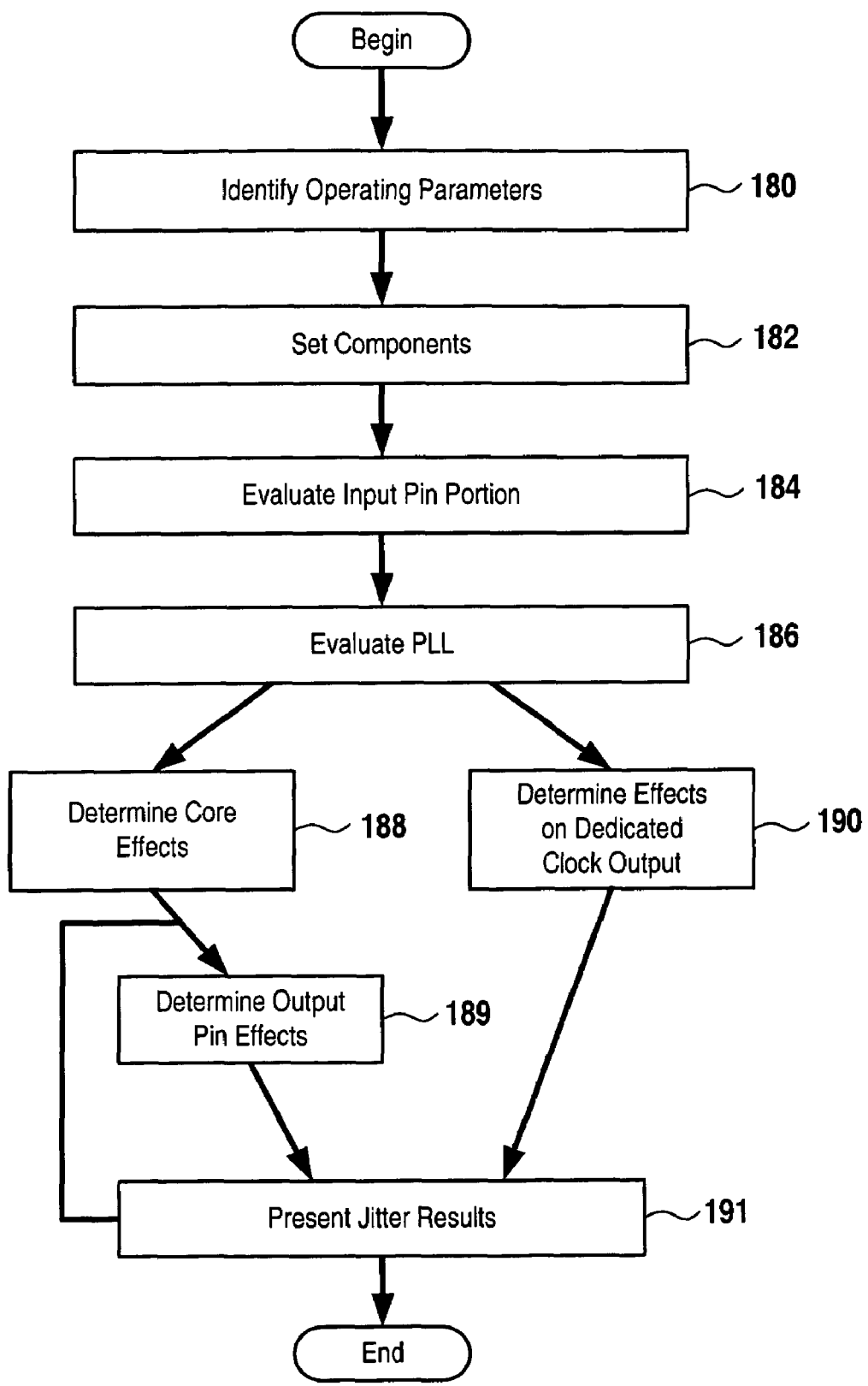
FIG. 9 is a flow chart diagram illustrating the method operations for generating a jitter number according to a specified design in accordance with one embodiment of the invention.

FIG. 9 is a flow chart diagram illustrating the method operations for generating a jitter number according to a specified design in accordance with one embodiment of the invention. The method initiates with operation 180 where operating parameters are identified. These operating parameters may include the cleanliness of power, temperature, frequencies on pins, settings on the part, etc. In essence, the environmental conditions in which a chip may be operating around and within are identified in operation 180. The method then advances to operation 182 where the components settings are provided. In one embodiment, these settings may be the configuration for the chip if the chip is a programmable logic device. The method then proceeds to operation 184 where the Input pin portion is analyzed and evaluated for its impact on the input path. Here, with regard to FIGS. 2, and 4-7, the impact of I/O drivers on the timing signals is evaluated. For example, the placement of the IO pins may be adjusted based on the activity/switching of the pins as mentioned above. The method then advances to operation 186 where the PLL is evaluated in order to determine its contribution to timing issues. In one embodiment the attenuation/magnification of incoming jitter to the PLL is determined. The PLL is looked at in terms of core effects in operation 188. That is, the core effects, such as the jitter in the clock distribution network and the input clock tree, are considered in conjunction with the PLL effects. With regard to operation 188 these core effects may be determined as discussed with reference to FIGS. 2 and 3. In another embodiment, the clock system is looked at in terms of external jitter observed at the device outputs. For example, aggressor I/Os may be impacting the jitter and the effect of these aggressor I/Os in operations 190 and/or 189 is determined. It should be appreciated that operation 189 is optional and may be bypassed as indicated in FIG. 9. With regard to operations 189 and 190, the external jitter effects may be determined as discussed with reference to FIG. 7. In operation 191 the jitter results are presented to a user. As mentioned above, the results may be presented in numerous formats, e.g., as a spectrum, for each module, or as a sum of the individual modules.

Figure 10:
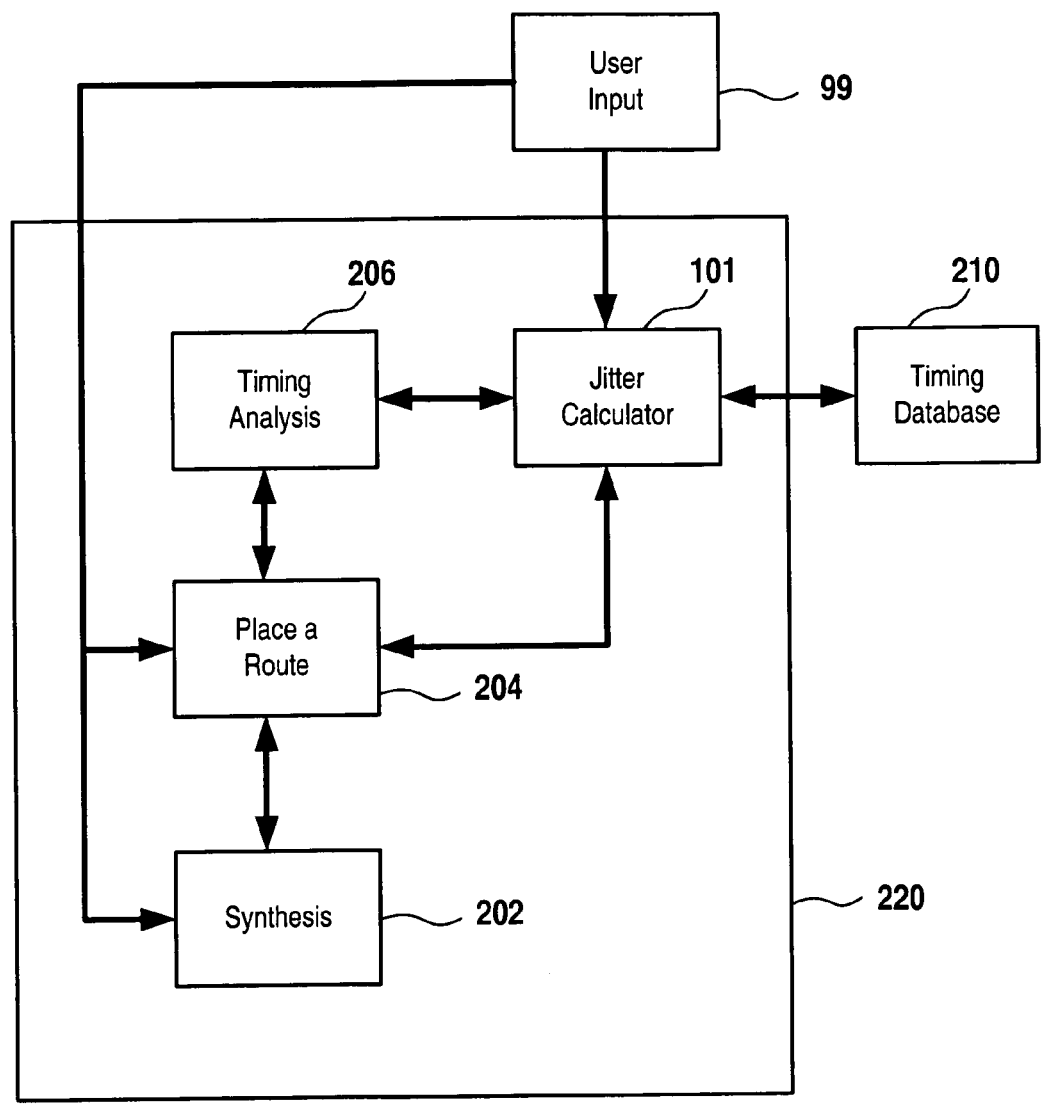
FIG. 10 is a simplified schematic diagram illustrating the modules of an electronic design automation system in accordance with one embodiment of the invention.

FIG. 10 is a simplified schematic diagram illustrating the modules of an electronic design automation system in accordance with one embodiment of the invention. Electronic design automation system 220 will include a synthesis module 202, place and routing module 204, timing and analysis module 206 and jitter calculator 101. Jitter calculator 101 includes the functionality described herein with regards to FIGS. 1-9. Timing database 210 will be used as a reference for jitter calculator 101 in order to provide data for a specific design. Synthesis module 202, place and routing module 204 and timing analysis module 206 may be common modules used in the Assignee's QUARTUS design automation tool in one embodiment of the invention. As illustrated, user input 99 is provided to synthesis module 202, place and route module 204, and jitter calculator 101. It should be appreciated that any electronic design automation tool may be used and the invention is not limited to the QUARTUS Design tool. As mentioned above, jitter calculator 101, may also be a stand-alone module.

Figure 11:
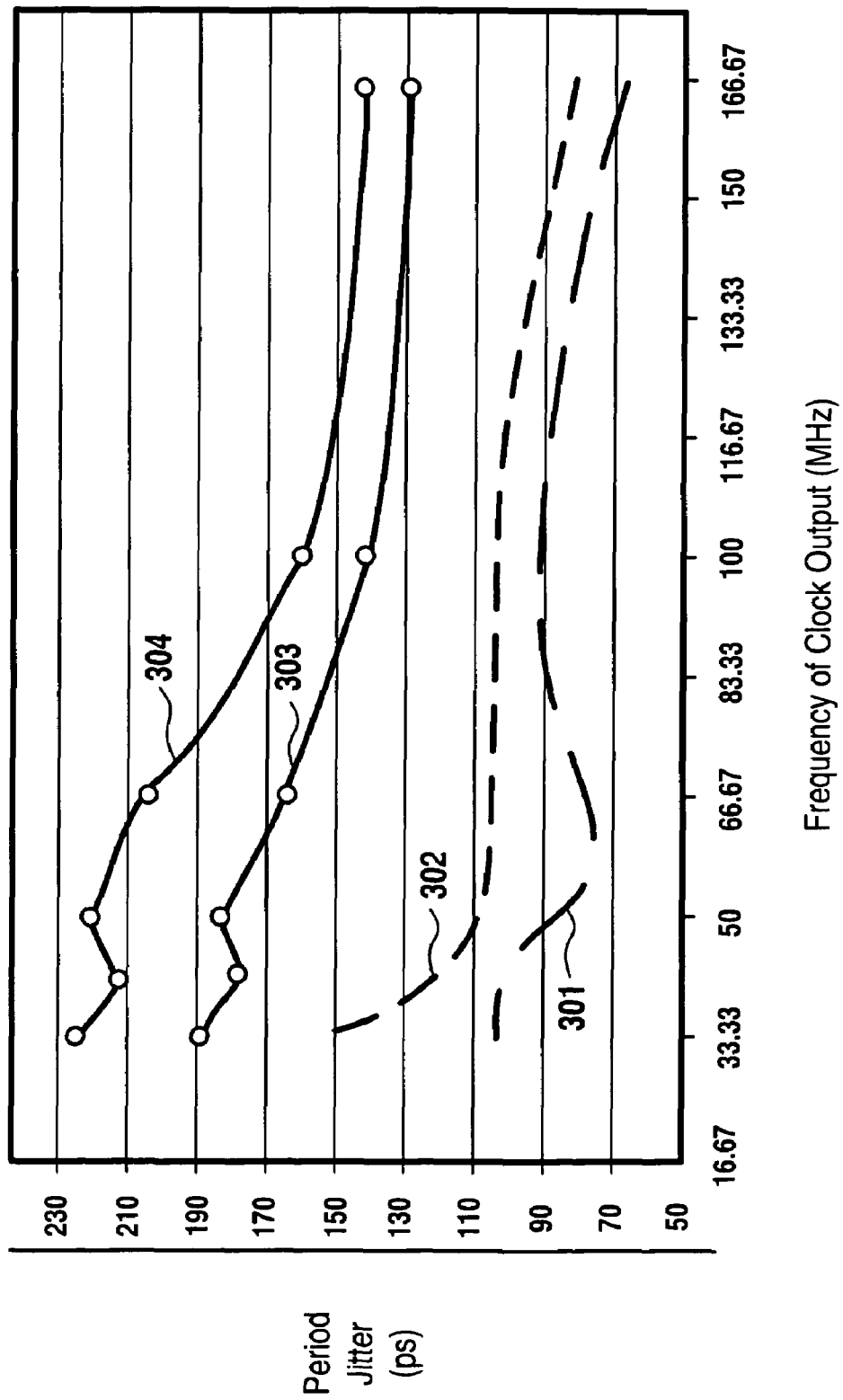
FIG. 11 is a graph illustrating the relative contribution of the phase lock loop to the system noise, i.e., jitter, in accordance with one embodiment of the invention.

FIG. 11 is a graph illustrating the relative contribution of the phase lock loop to the system noise, i.e., jitter, in accordance with one embodiment of the invention. As illustrated, line 301 was generated with the PLL being bypassed and the system relatively quiet, while line 302 was generated with the PLL not being bypassed and the system operating relatively quiet conditions. Line 303 was generated with the PLL bypassed and the system relatively noisy, while line 304 was generated with the PLL not being bypassed and the system operating under relatively noisy conditions. From the results displayed by FIG. 11, one skilled in the art will appreciate that most of the noise is due to other effects than the PLL, e.g., the I/O effects discussed above. Thus, where this relationship exists, one skilled in the art may focus their evaluation on the core effects and the I/O effects discussed above. However, the jitter calculator discussed herein will also provide information on the core effects and the PLL effects to provide the designer with additional information.

The jitter calculator described herein may be used for the design of any suitable integrated circuit. For example, some types of programmable logic devices that may use the jitter calculator in the design process include as programmable array logic (PAL), programmable logic array (PLA), field programmable logic array (FPLA), electrically programmable logic devices (EPLD), electrically erasable programmable logic device (EEPLD), logic cell array (LCA), just to name a few. The programmable logic device may be a part of a data processing system that includes one or more of the following components: a processor, memory; I/O circuitry, and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for calculating system jitter in an integrated circuit design, comprising method operations of:
    identifying operating parameters associated with the integrated circuit design;
    evaluating interaction between Input/Output (I/O) pins based on placement of the I/O pins in the integrated circuit design;
    determining an effect of the interaction between Input/Output (I/O) pins on the system jitter;
    evaluating an impact of a phase lock loop (PLL) to jitter of an incoming signal to the PLL; and
    combining the impact of the PLL to jitter of the incoming signal and the effect of the interaction between Input/Output (I/O) pins to derive the system jitter.

2. The method of claim 1, wherein the method operation of evaluating an impact of a phase lock loop (PLL) to jitter of an incoming signal to the PLL includes,
    determining effects of a core clock tree on internal jitter.

3. The method of claim 1, wherein the method operation of evaluating an impact of a phase lock loop (PLL) to jitter of an incoming signal to the PLL includes,
    determining an effect of a dedicated clock output signal based on the impact of the PLL.

4. The method of claim 1, wherein the method operation of determining an effect of the interaction between Input/Output (I/O) pins on the system jitter includes,
    identifying frequent switching pins; and
    determining whether any frequent switching pins are proximate to a voltage supply pin so as to induce one of a capacitive coupling or inductive coupling effect on the voltage supply pin.

5. The method of claim 4, further comprising:
    recommending movement of the voltage supply pin in the circuit design to a location not proximate to the frequent switching pins.

6. The method of claim 1, wherein the system jitter is represented over a spectrum.

7. The method of claim 2, further comprising:
    identifying a high activity logic region within a core region of the integrated circuit design;
    identifying a low activity logic region within the core region; and
    transferring a portion of logic from the high activity logic region to the low activity logic region.

8. A jitter calculator engine for estimating system jitter within a circuit design, comprising:
    a core effects module estimating core jitter caused by noise effects impacting a core clock network;
    an input/output (I/O) module estimating I/O input pin switching effects on a clock network input signal, the I/O module identifying a relative frequency of switching by I/O pins into the circuit design; and
    a phase lock loop (PLL) module for estimating an effect of a PLL on a signal delivered to the PLL from an I/O pin, the PLL module accounting for I/O input pin switching effects and core jitter.

9. The jitter calculator engine of claim 8, wherein each module is defined through computer code capable of achieving corresponding functionality.

10. The jitter calculator engine of claim 8, wherein the jitter calculator receives input concerning I/O pin placement and logic placement.

11. The jitter calculator engine of claim 8, wherein the jitter calculator engine is incorporated into an electronic design automation module that performs placement and routing functionality for the circuit design.

12. The jitter calculator engine of claim 8, wherein the core effects module further estimates the output clock tree jitter used to drive outputs communicated to chips external to the designed circuit.

13. The jitter calculator engine of claim 8, wherein the jitter calculator ranks contributions from each module to the system jitter.

14. The jitter calculator engine of claim 8, further comprising:
    an output module providing recommendations for moving I/O pins in the circuit design based upon the frequency of switching and recommendations for distributing core logic portions based upon an activity level for the core logic portion.

15. A computer readable medium having program instructions for calculating system jitter in an integrated circuit design, comprising:
    program instructions for identifying operating parameters associated with the integrated circuit design;
    program instructions for evaluating interaction between Input/Output (I/O) pins based on placement of the I/O pins in the integrated circuit design;
    program instructions for determining an effect of the interaction between Input/Output (I/O) pins on the system jitter;
    program instructions for evaluating an impact of a phase lock loop (PLL) to jitter of an incoming signal to the PLL; and program instructions for combining the impact of the PLL to jitter of the incoming signal and the effect of the interaction between Input/Output (I/O) pins to derive the system jitter.

16. The computer readable medium of claim 15, wherein the program instructions for evaluating an impact of a phase lock loop (PLL) to jitter of an incoming signal to the PLL includes, program instructions for determining effects of a core clock tree on internal jitter.

17. The computer readable medium of claim 15, wherein the program instructions for evaluating an impact of a phase lock loop (PLL) to jitter of an incoming signal to the PLL includes, program instructions for determining an effect of a dedicated clock output signal based on the impact of the PLL.

18. The computer readable medium of claim 15, wherein the program instructions for determining an effect of the interaction between Input/Output (I/O) pins on the system jitter includes, program instructions for identifying frequent switching pins; and program instructions for determining whether any frequent switching pins are proximate to a voltage supply pin so as to induce one of a capacitive coupling or inductive coupling effect on the voltage supply pin.

19. The computer readable medium of claim 18, further comprising:

program instructions for recommending movement of the voltage supply pin in the circuit design to a location not proximate to the frequent switching pins.

20. The computer readable medium of claim 16, further comprising:

program instructions for identifying a high activity logic region within a core region of the integrated circuit design;

program instructions for identifying a low activity logic region within the core region; and program instructions for transferring a portion of logic from the high activity logic region to the low activity logic region.

* * * * *